(12) United States Patent
Boyanov et al.

(10) Patent No.: US 9,373,584 B2
(45) Date of Patent: Jun. 21, 2016

(54) METHODS AND APPARATUSES TO FORM SELF-ALIGNED CAPS

(75) Inventors: Boyan Boyanov, Portland, OR (US); Kanwal Jit Singh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/991,899

(22) PCT Filed: Nov. 4, 2011

(86) PCT No.: PCT/US2011/059453
§ 371 (c)(1),
(2), (4) Date: Jun. 5, 2013

(87) PCT Pub. No.: WO2013/066356
PCT Pub. Date: May 10, 2013

(65) Prior Publication Data
US 2013/0256899 A1    Oct. 3, 2013

(51) Int. Cl.
*H01L 21/76*      (2006.01)
*H01L 23/532*     (2006.01)
*H01L 21/768*     (2006.01)
*H01L 23/485*     (2006.01)
*H01L 23/528*     (2006.01)

(52) U.S. Cl.
CPC ...... *H01L 23/53238* (2013.01); *H01L 21/7685* (2013.01); *H01L 21/76849* (2013.01); *H01L 21/76883* (2013.01); *H01L 23/485* (2013.01); *H01L 23/528* (2013.01); *H01L 23/53209* (2013.01); *H01L 23/53295* (2013.01); *H01L 2924/0002* (2013.01)

(58) Field of Classification Search
CPC .................. H01L 2924/00014; H01L 2924/00; H01L 2924/0002; H01L 2224/13147; H01L 2224/48247; H01L 21/7685; H01L 23/485
USPC .......................... 257/773, 762, 767, 741, 750
See application file for complete search history.

(56) References Cited

U.S. PATENT DOCUMENTS

| 5,470,789 | A  | * | 11/1995 | Misawa ........................ 438/643 |
| 7,338,908 | B1 | * | 3/2008  | Koos et al. .................... 438/745 |
| 7,396,759 | B1 |   | 7/2008  | Van Schravendijk et al. |
| 2005/0001325 | A1 | * | 1/2005 | Andricacos et al. .......... 257/762 |
| 2006/0128144 | A1 |   | 6/2006 | Park et al. |
| 2009/0127097 | A1 |   | 5/2009 | Chen et al. |
| 2009/0283499 | A1 | * | 11/2009 | Mayer et al. .................... 216/90 |

OTHER PUBLICATIONS

Chih-Kai Hsu "Electromigration Study on Sn capped Air-gap Cu Damascenes Structure", 2006.

(Continued)

*Primary Examiner* — Chuong A Luu
*Assistant Examiner* — Rodolfo Fortich
(74) *Attorney, Agent, or Firm* — Blakely, Sokoloff, Taylor & Zafman LLP

(57) ABSTRACT

At least one conductive line in a dielectric layer over a substrate is recessed to form a channel. The channel is self-aligned to the conductive line. The channel can be formed by etching the conductive line to a predetermined depth using a chemistry comprising an inhibitor to provide uniformity of etching independent of a crystallographic orientation. A capping layer to prevent electromigration is deposited on the recessed conductive line in the channel. The channel is configured to contain the capping layer within the width of the conductive line.

11 Claims, 10 Drawing Sheets

(56) References Cited

OTHER PUBLICATIONS

Korean Patent Application No. 10-2014-7015212, Office Action (with English translation), dated Aug. 3, 2015 (14 pages).
Taiwan (R.O.C.) Patent Application No. 101140536, Office Action (with English translation), dated Aug. 13, 2015, (17 pages).
China Patent Application No. 201180074611.5, Office Action, dated Nov. 16, 2014, (9 pages).
Taiwan Patent Application No. 101140536, Office Action and Taiwan IPO Search Report (with English translation), dated Nov. 27, 2014, (15 pages).
Ota, Takashi, et al., "Experimental Evaluation of Out-of-Plane Distortion of Electrostatically Chucked EUV Reticle," Proc. Of SPIE vol. 6921, 69213S, (2008).
M.M Antonijevic et al., "Copper Corrosion Inhibitors. A review", Int. J. Electrochem Sci., vol. 3, 2008, 28 pages.
T. Saito et al., "A Robust, Deep-Submicron Copper Interconnect Structure using Self-Aligned Metal Capping Method", IEEE, 2004, 3 pages.
PCT International Search Report and Written Opinion for PCT/US2011/059453, mailed Jul. 16, 2012 (14 pp.).
International Preliminary Report on Patentability (Chapter 1 of the Patent Cooperation Treaty) for PCT/US2011/059453, mailed May 6, 2014 (8 pages).

* cited by examiner

US 9,373,584 B2

METHODS AND APPARATUSES TO FORM SELF-ALIGNED CAPS

CROSS-REFERENCE TO RELATED APPLICATIONS

This patent application is a U.S. National Phase application under 35 U.S.C.§371 of International Application No. PCT/US2011/059453, filed Nov. 4, 2011, entitled "METHODS AND APPARATUSES TO FORM SELF-ALIGNED CAPS".

FIELD

Embodiments of the present invention relate to the field of electronic device manufacturing, and in particular, to forming interconnect structures.

BACKGROUND

As the feature size of electronic devices shrinks, reliability of interconnects becomes critical to integrated circuit performance. Generally, electromigration refers to the transport of material caused by the movement of the ions in a conductor due to the momentum transfer between conducting electrons and diffusing metal atoms. The effect is especially important in applications where high current densities are used, for example, in microelectronics structures involving logic devices. Typically, a metal capping technology is used to prevent electromigration.

FIG. 1A is a cross-sectional view of a typical interconnect structure having metal electromigration caps. As shown in FIG. 1A, metal interconnect lines, for example lines 103 and 104, formed on a dielectric substrate 101 are originally spaced apart at a line spacing 105. The electromigration caps, for example, caps 111-113, can be grown on the respective interconnect lines above a flat surface of the substrate using electroless plating. Generally, the growth of the electromigration caps on the interconnect lines is isotropic. The electromigration cap can grow on the interconnect metal line vertically as well as laterally above the substrate. The lateral growth of the metal electromigration caps may generate overhang structures, for example, an overhang 109 that protrude over the substrate 101 outside the width of the interconnect lines. As shown in FIG. 1A, the lateral growth of the metal caps reduces a line-to-line spacing from spacing 105 to spacing 107.

Typically, the size of the overhang 109, is about 50% of the cap thickness. For example, if the two neighboring metal caps have the thickness of about 10 nanometers ("nm"), the total size of their overhangs can be about 2×5 nm. As such, the line-to-line spacing can be reduced, for example, by a factor of two from about 20 (nm) to about 10 nm.

FIG. 1B is a top view of a typical interconnect structure having metal electromigration caps electrolessly grown over a flat surface of substrate 121 having interconnect lines, such as an interconnect line 123. As shown in FIG. 1B, the lateral growth of the metal caps above the substrate increases the line edge roughness ("LER") and reduces line-to-line spacing. As shown in FIG. 1B, the line-to-line spacing, for example, a line-to-line spacing 125, varies uncontrollably. Both the increased LER and reduced line-to-line spacing negatively impact on the reliability of the interconnect structures, increase the risk of current shorting that may lead to the failure of the entire integrated circuit device.

BRIEF DESCRIPTION OF THE DRAWINGS

The present invention is illustrated by way of example and not limitation in the figures of the accompanying drawings, in which like references indicate similar elements, in which.

DETAILED DESCRIPTION OF THE PRESENT INVENTION

Figure 1A:
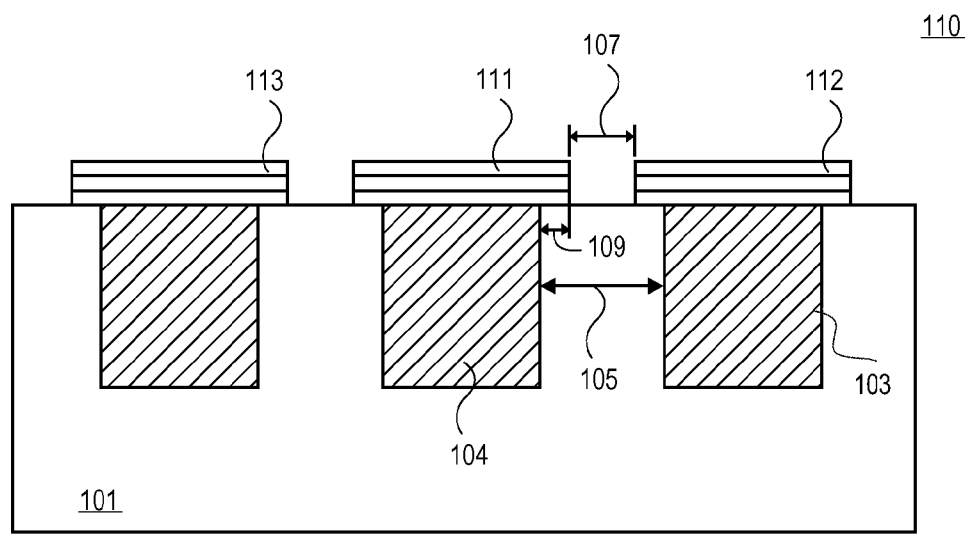
FIG. 1A is a cross-sectional view of a typical interconnect structure having metal electromigration caps.
Figure 1B:
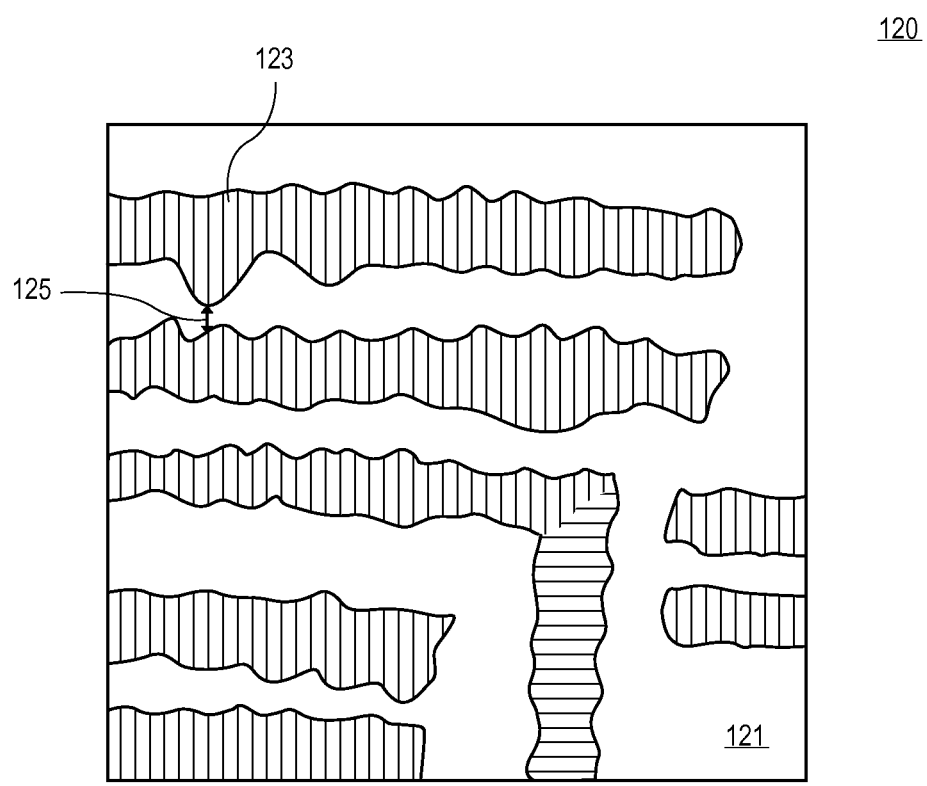
FIG. 1B is a top view of a typical interconnect structure having metal electromigration caps.

In the following description, numerous specific details, such as specific materials, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "for an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Methods and apparatuses to control a line edge roughness ("LER") and line-to-line spacing in deposition of self-aligned metal caps are described herein. At least one conductive line is recessed to form a channel in a dielectric layer over a substrate. A capping layer to prevent electromigration is deposited on the recessed conductive line in the channel. The channel is self-aligned to the conductive line. The channel is configured to contain the capping layer within the width of the conductive line. That is, the interconnect line is recessed to contain the cap growth within a channel self aligned to the interconnect line. The channel can be formed by etching the conductive line to a predetermined depth using a chemistry comprising an inhibitor to provide uniformity of etching independent of a crystallographic orientation, as described in further detail below. Methods and apparatuses described herein can be used to control the increase in LER associated with selectively deposited electromigration caps, for example, electroless cobalt caps. That is, an increase in LER and reduction in line-to-line spacing typically associated with the electromigration caps selectively deposited on the metal interconnect lines can be prevented by containing an electroless cap within a recess that is self-aligned to an interconnect line. Eliminating an increase in LER and preventing from reducing of the line-to-line spacing can decrease the risk of failure and increase the manufacturing yield of the electronic devices having reduced (e.g., nanometer scale) dimensions. The electronic devices can be, for example, computer system architecture devices, e.g., transistors, memories, logic devices, and any other integrated circuit and microelectronic devices.

Figure 2A:
FIG. 2A shows a cross-sectional view of a substrate to fabricate an interconnect structure according to one embodiment of the invention.

FIG. 2A shows a cross-sectional view 200 of a substrate to fabricate an interconnect structure according to one embodiment of the invention. In one embodiment, substrate 201 includes a monocrystalline silicon. In one embodiment, substrate 201 includes a silicon-on-insulator ("SOI"). For alternate embodiments, substrate may comprise compound semiconductors, e.g., indium phosphide, gallium arsenide, gallium nitride, silicon germanium, and silicon carbide. In another embodiment, substrate 201 may include e.g., glass, and quartz. Substrate 201 may include one or more metallization layers of integrated circuits having active and passive devices, e.g., transistors, switches, optoelectronic devices, capacitors, resistors, interconnects (not shown). The one or more metallization layers of integrated circuits of substrate 201 may be separated from adjacent metallization layers by a dielectric material (not shown), e.g., interlayer dielectric. The adjacent metallization layers may be electrically interconnected by vias (not shown).

Figure 2B:
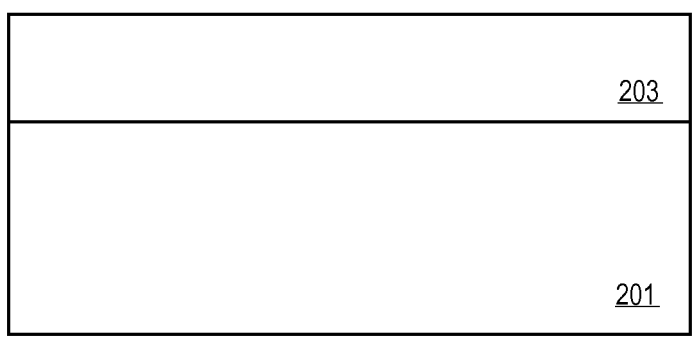
FIG. 2B is a view similar to FIG. 2A, after a dielectric layer is formed over the substrate according to one embodiment of the invention.

FIG. 2B is a view similar to FIG. 2A, after a dielectric layer 203 is formed over the substrate 201 according to one embodiment of the invention. In one embodiment, dielectric layer 203 is an interlayer dielectric ("ILD"). In one embodiment, dielectric layer 203 is a low-k dielectric, e.g., silicon dioxide, silicon oxide, and carbon doped oxide ("CDO"), or any combination thereof. In one embodiment, Dielectric layer 203 includes a nitride, oxide, a polymer, phosphosilicate glass, fluorosilicate ("SiOF") glass, organosilicate glass ("SiOCH"), or any combination thereof. In one embodiment, dielectric layer 203 includes a spin-on low-k dielectric material. In one embodiment, dielectric layer 203 is silicon dioxide. In another embodiment, dielectric layer 203 is silicon nitride. dielectric layer 203 may be deposited using any suitable deposition technique. In one embodiment, dielectric layer 203 may be deposited using blanket deposition technique, for example, chemical vapor deposition ("CVD"), sputtering, spin-on, or another thin film deposition technique. In one embodiment, dielectric layer 203 is deposited to the thickness in the approximate range of 50 nm to 2 μm.

Figure 2C:
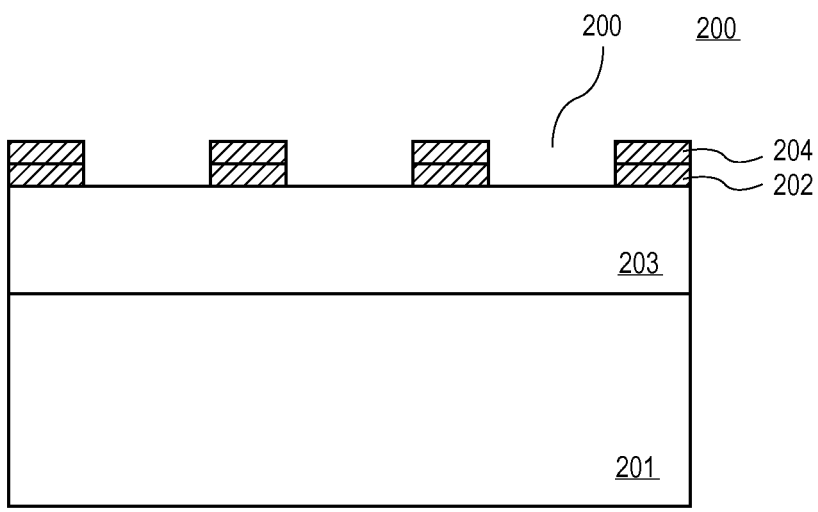
FIG. 2C is a view similar to FIG. 2B, after a photoresist layer is deposited over the dielectric layer to form one or more openings in the dielectric layer according to one embodiment of the invention.

FIG. 2C is a view similar to FIG. 2B, after a photoresist layer 204 is deposited over dielectric layer 203 to form one or more openings in dielectric layer 203 according to one embodiment of the invention. In one embodiment, photoresist layer 204 is deposited on a hard mask layer 202 formed on dielectric layer 203, as shown in FIG. 2C. In another embodiment, photoresist layer 204 is deposited directly onto dielectric layer 203. As shown in FIG. 2C, photoresist layer 204 and hard mask layer 202 are patterned and etched to form openings, such as an opening 220. Patterning and etching of the photoresist and hard mask is known to one of ordinary skill in the art of microelectronic device manufacturing. Patterning and etching of the photoresist may be performed using one of the techniques known to one of ordinary skill in the art of microelectronic device manufacturing. The technique may include masking the photoresist layer, exposing the masked layer to light, and then developing the unexposed portions to remove the portions of the photoresist layer that are exposed to light to form a window in the photoresist layer. In one embodiment, the process of exposing to light and removing the photoresist layer may be performed in a plasma reactor. The opening in hard mask 202 may be etched to expose a portion of dielectric layer 203 using a dry etching, e.g., reactive ion etching ("RIE"), wet etching, or any combination thereof techniques.

Figure 2D:
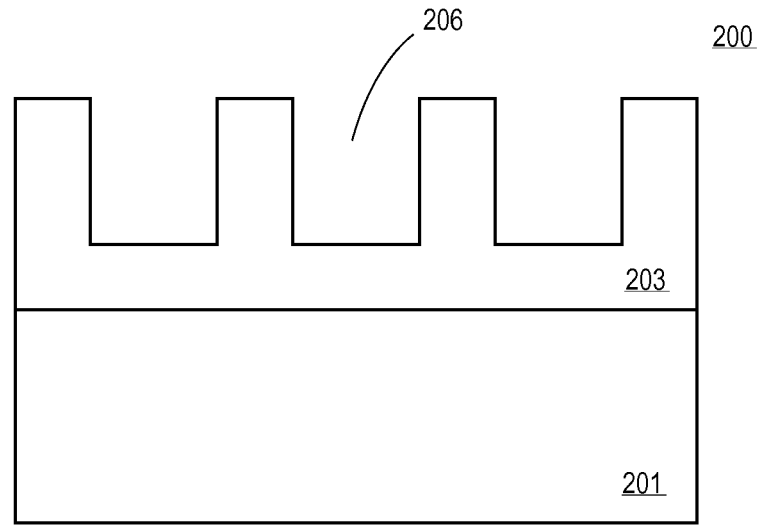
FIG. 2D is a view similar to FIG. 2C, after one or more openings are formed in the dielectric layer according to one embodiment of the invention.

FIG. 2D is a view similar to FIG. 2C, after one or more openings, such as an opening 206, are formed in dielectric layer 203 according to one embodiment of the invention. In one embodiment, the openings are, such as opening 206, is etched through openings in hard mask 203, such as opening 220. In another embodiment, the openings are formed by etching the dielectric layer through the openings in patterned photoresist 204 deposited directly onto dielectric layer 203. In one embodiment, the openings in the dielectric layer 203, for example, trenches, are formed using an anisotropic dry etching, e.g., plasma etching. In another embodiment, the openings in the dielectric layer 203 are formed using dry etching, wet etching, or a combination thereof techniques known to one of ordinary skill in the art of microelectronic device manufacturing. In one embodiment, the openings in dielectric layer 203 has the width in the approximate range of 0.005 microns ("μm") to 5 μm, and the depth in the approximate range of 0.005 µm to 10 µm. In one embodiment, the size of openings is determined by the size of a conductive line formed within ILD 203 later on in the process.

After forming the openings, such as opening 206, the photoresist and hard mask are removed. Removing of the photoresist and the hard mask from dielectric layer 203 is known to one of ordinary skill in the art of microelectronic device manufacturing. In one embodiment, the photoresist and hard mask may be removed using a chemical technique, mechanical technique, or both.

Figure 2E:
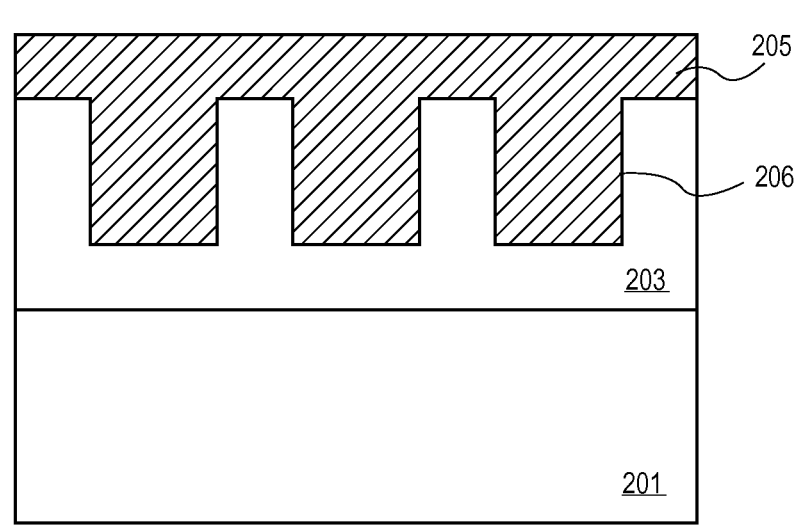
FIG. 2E is a view similar to FIG. 2D, after a conductive layer is deposited over the dielectric layer according to one embodiment of the invention.

FIG. 2E is a view similar to FIG. 2D, after a conductive layer 205 is deposited over dielectric layer 203 according to one embodiment of the invention. As shown in FIG. 2E, forming of the conductive layer 205 involves filling the one or more openings in dielectric layer 203 with a conductive material to form one or more conductive lines. In one embodiment, a base layer (not shown) is first deposited on dielectric layer 203 covering the internal sidewalls and bottom of the openings, and then a conductive layer 205 is deposited on the base layer. In one embodiment, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into ILD 203. Additionally, the conductive barrier layer can be used to provide adhesion for the seed layer (e.g., copper). In one embodiment, to form the base layer, the conductive barrier layer is deposited onto the dielectric layer 203 covering the sidewalls and bottom of the opening, and then the seed layer is deposited on the conductive barrier layer. In another embodiment, the conductive base layer includes the seed layer that is directly deposited onto dielectric layer 203 covering the sidewalls and bottom of the openings. Each of the conductive barrier layer and seed layer may be deposited using any thin film deposition technique known to one of ordinary skill in the art of semiconductor manufacturing, e.g., by sputtering, blanket deposition, and the like. In one embodiment, each of the conductive barrier layer and the seed layer has the thickness in the approximate range of 1 to 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

Conductive layer 205 fills the openings, such as an opening 206, and covers portions of the base layer (not shown) outside of the openings that are on top of dielectric layer 203. In one embodiment, conductive layer 205 e.g., copper, is deposited onto the seed layer of base layer of copper, by an electroplating process. In one embodiment, conductive layer 205 is deposited into the openings using a damascene process that is known to one of ordinary skill in the art of microelectronic device manufacturing. In one embodiment, conductive layer 205 is deposited onto the seed layer using one of selective deposition techniques known to one of ordinary skill in the art of semiconductor manufacturing, e.g., electroplating, electroless plating, and the like. In one embodiment, the choice of a material for conductive layer 205 determines the choice of a material for the seed layer. For example, if the material for conductive layer 205 includes copper, the material for the seed layer also includes copper. In one embodiment, conductive layer 205 includes e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

Figure 2F:
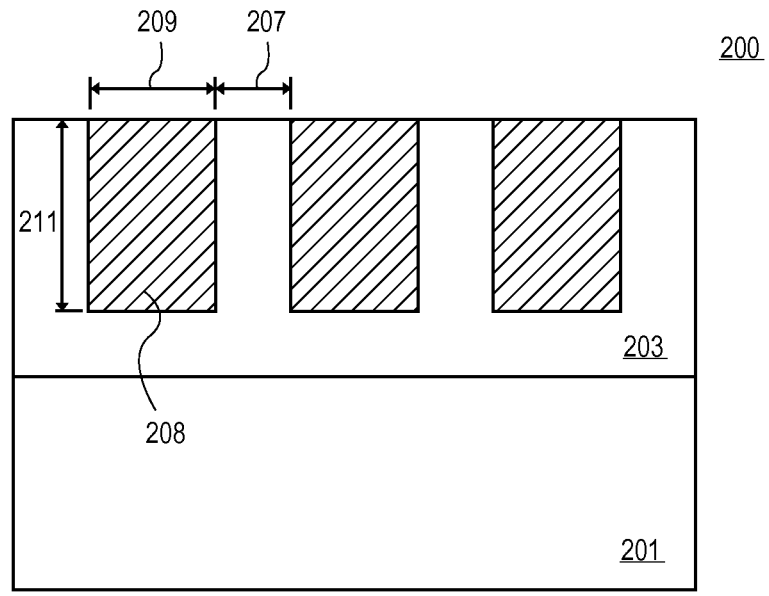
FIG. 2F is a view similar to FIG. 2E, after portions of conductive layer and the base layer are removed from the top surface of the dielectric layer outside the openings to form patterned conductive lines according to one embodiment of the invention.

FIG. 2F is a view similar to FIG. 2E, after portions of conductive layer 205 and the base layer are removed from the top surface of dielectric layer 203 outside the openings to form patterned conductive lines, such as a conductive line 208 according to one embodiment of the invention. Portions of conductive layer 205 may be removed chemically, e.g., using etching, mechanically, e.g., using polishing, or by a combination of thereof techniques, e.g., using a chemical-mechanical polishing ("CMP") technique known to one of ordinary skill in the art of microelectronic device manufacturing. In one embodiment, one or more patterned conductive lines are formed within dielectric layer 203 using methods described above. In another embodiment, the conductive lines are formed by patterning and etching of the conductive layer deposited on the top surface of dielectric layer 203. Patterning and etching of the conductive layer deposited on the top surface of the dielectric layer 203 is known to one of ordinary skill in the art of microelectronic device manufacturing. In one embodiment, the thickness of the conductive line, for example, a thickness 211 is in the approximate range of 0.015 µm to 1 µm. In one embodiment, the width of the conductive line, for example, a width 209 is in the approximate range of 5 nm to about 500 nm. In one embodiment, the spacing between the conductive lines, for example, a spacing 207, is from about 5 nm to about 500 nm. In one embodiment, the spacing between the conductive lines is from about 2 nm to about 100 nm.

Figure 2G:
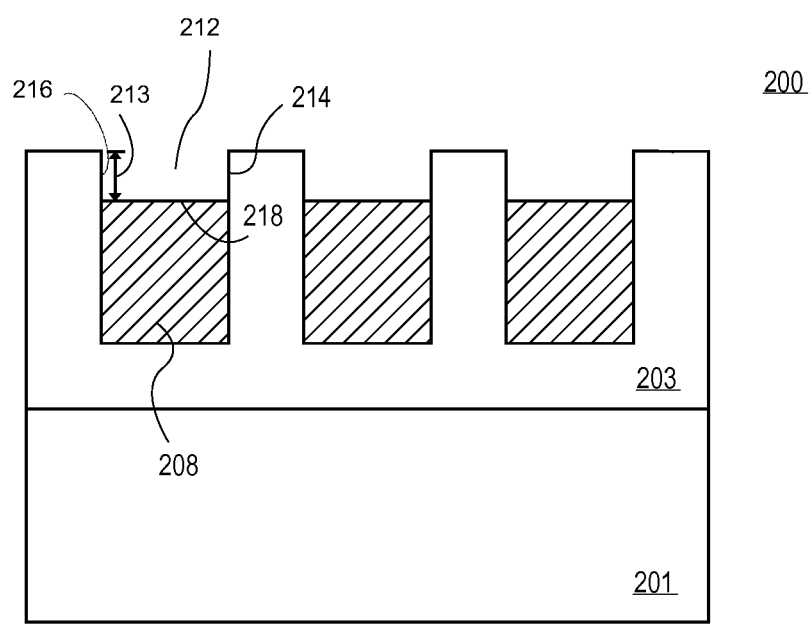
FIG. 2G is a view similar to FIG. 2F, after conductive lines in a dielectric layer over a substrate are recessed according to one embodiment of the invention.

FIG. 2G is a view similar to FIG. 2F, after the conductive lines, for example, a conductive line 208, in a dielectric layer over a substrate are recessed according to one embodiment of the invention. As shown in FIG. 2G, channels, such as a channel 212, are formed in dielectric layer 203. As shown in FIG. 2G, channels, such as channel 212, have sidewalls made of dielectric layer 203, such as sidewalls 214 and 216, and a bottom made of a respective conductive line, such as a bottom 218 made of conductive line 208.

In one embodiment, the channel has depth, such as a depth 213 from about 5 nm to about 50 nm. In one embodiment, the depth of the channel is from about 2 nm to about 20 nm. In one embodiment, the channel has depth that is from about 10% to about 50% of the thickness of the conductive line, such as a thickness 211 shown in FIG. 2F. In one embodiment, the conductive lines are recessed to the depth, which is determined based on the thickness of a capping layer, as described in further detail below.

Figure 3A:
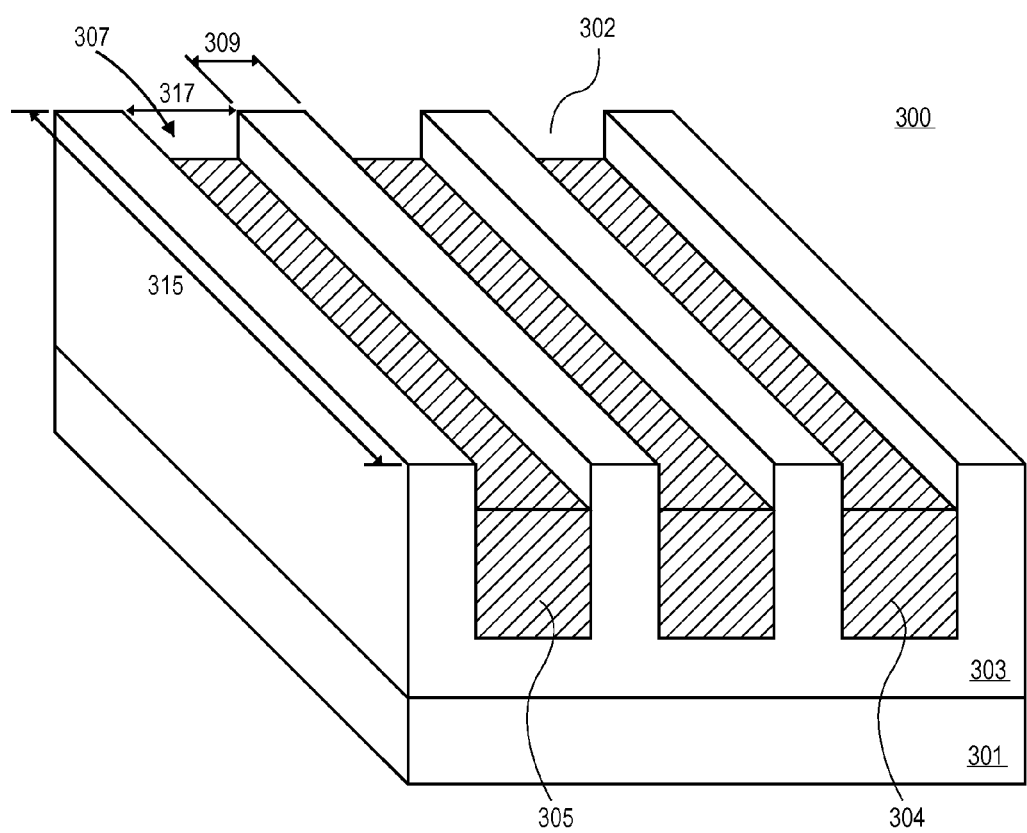
FIG. 3A is a three-dimensional view 300 of an interconnect structure after recessing the conductive lines in a dielectric layer over a substrate according to one embodiment of the invention.

FIG. 3A is a three-dimensional view 300 of an interconnect structure after recessing the conductive lines, such as a conductive line 305 and a conductive line 304, in a dielectric layer 303 over a substrate 301 according to one embodiment of the invention. Substrate 301, dielectric layer 303, and the conductive lines 305 and 304, can be, for example, any of the respective substrates, dielectric layers, and conductive lines, as described above. As shown in FIG. 3A, channels, such as a channel 302 and a channel 307, are formed in a dielectric layer 303 over substrate 301 by recessing the conductive lines. As shown in FIG. 3A, the channels are self-aligned to the respective conductive lines. For example, channel 307 is self-aligned to conductive line 305 and channel 302 is self-aligned to conductive line 304. As shown in FIG. 3A, the length of the channel, e.g., a length 315 is along the length of the conductive line, and the width of the channel, e.g., a width 307 is along the width of the conductive line. In one embodiment, the length of the channel is substantially longer that the width of the channel. In one embodiment, the width of the channel is less than 100 nm, and the length of the channel is at least 500 nm. In one embodiment, the width of the channel is from about 5 nm to about 500 nm, and the length of the channel is from about a few hundred nanometers to about a few hundred microns. As shown in FIG. 3A, the conductive lines, such as conductive lines 305 and 304 are separated by a distance, such as a spacing 309. In one embodiment, the spacing between the conductive lines, such as lines 305 and 304 is from about 5 nm to about 500 nm. In one embodiment, the spacing between the conductive lines, such as lines 305 and 304 is from about 2 nm to about 100 nm.

In one embodiment, recessing the conductive lines, such as line 208, lines 304 and 305, involves wet etching the conductive lines uniformly independent of a crystallographic orientation using a chemistry containing an etchant, an oxidizer, an inhibitor, and a solvent. That is, adding an inhibitor and a solvent to the etchant provides uniform etching of the conductive material independent of a crystallographic orientation, by forming, during etching, a passivation layer (not shown) on the conductive material. The wet etch chemistry containing an etchant, an oxidizer, an inhibitor, and solvent provides control over the depth of the etching of the conductive line, so that only a portion (e.g., 5% to 50%) of the conductive line can be recessed.

In one embodiment, the chemistry to wet etch the conductive lines to provide a channel that is free from a pattern dependence and a crystallographic preference comprises between about 1% to about 40% by mass of an etchant, between about 1% to about 10% by mass of an oxidizer, and between about 0.1% to about 1% by mass of an inhibitor, and between about 1 to about 60% by mass of an organic solvent. In one embodiment, the chemistry to wet etch the conductive lines comprises an etchant from about 0.1% to about 70% by mass (depending on the etch rate of the etchant), an oxidizer from about 0.1% to about 10% by mass (depending on the strength of the oxidizer), an inhibitor from about 50 parts per million (ppm) to about 1% by mass; and a solvent between about 1 to about 60% by mass.

In one embodiment, the chemistry to etch the conductive lines can include an etchant, for example, a glycine, an ethylenediaminetetraacetic acid, an alpha-amino acid, a polycarboxylic acid, or a combination thereof; the oxidizer, for example, a peroxide, an ozone, a permanganate, a chromate, a perborate, a hypohalite, or a combination thereof, an inhibitor, for example, an azole, an amine, an amino acid, a phosphate, a phosphonate, or a combination thereof, and a solvent. The solvent can be an aqueous system (preferred), e.g., water, or an organic solvent. The examples of an organic solvents are propylene carbonate, sulfolane, glycol ethers, methylene chloride, and the like.

For example, regarding the etchant in the chemistry to etch copper conductive lines, Cu metal is typically in a zero oxidation state. In order to etch copper, the copper needs to be oxidized into a 0+n oxidation state where 'n' can be any of 1, 2, 3 or 4. Typically, $1^{st}$ state and $2^d$ state are more common oxidation states of copper. For any molecule to act as an etchant, it needs to be able to bind copper in one of its oxidation states 1, 2, 3 or 4. This binding typically occurs through the use of group 15 (Nitrogen family), group 16 (Oxygen family) or group 17 (Halogen family) atoms in a molecule. In one embodiment, the etchant to etch copper conductive lines is an organic etchant, for example, any of glycine, ethylenediaminetetraacetic, alpha-amino acids, polycarboxylic acids (for example, citric acid that is a tricarboxylic acid), oxalic and malonic acids.

For example, an oxidizer in the chemistry to etch copper conductive lines is used to change the copper oxidation state from an insoluble copper metal to a soluble copper ion. The oxidizer can be chosen from any of the oxidizers, for example, any of peroxides (e.g., hydrogen peroxide), ozone, permanganates, chromates, perborates and hypohalites, and the like.

For example, to etch the copper constituting the current carrying line in a uniform and non-crystallographic orientation, it is important to add an inhibitor to the chemistry. The role of an inhibitor is to form a passivation layer (a polymeric compound formed from the molecules of the inhibitor binding copper in a specific and periodic manner). The formation of this passivation layer during the controlled etch of copper is critical to ensure uniformity of etching and preventing etching attacks (e.g., forming voids) along crystallographic (e.g., grain) boundaries. For example, any inhibitor that is not decomposed in the chosen oxidizer and etchant combination may be used in the chemistry to etch copper conductive lines. The classes of inhibitors are known to one of ordinary skill in the art of electronic device manufacturing. For example, any of organic inhibitors including azoles, amines, amino acids, phosphates and phosphonates can be used in the chemistry to etch the copper conductive lines.

In another embodiment, the conductive copper lines are recessed by wet etching using a chemistry comprising a citric acid and peroxide. A chemistry comprising citric acid and peroxide, however, typically has high etching rate that can be difficult to control. Additionally, an etching rate of the chemistry comprising citric acid and peroxide depends on a crystallographic orientation that may produce rough etched surface. Addition of a corrosion inhibitor, for example, benzotriazole ("BTA") to the chemistry, and dilution of the citric acid and peroxide in organic solvent can slow down the etching rate dramatically and eliminate the crystallographic nature of the etch, such as etching the voids in Cu along the grain boundaries producing a smooth surface.

In one embodiment, the conductive lines are recessed by wet etching that involves any of spraying, and pouring the etching chemistry onto the conductive lines. In one embodiment, the conductive lines are recessed by wet etching that involves immersing the conductive lines into the etching chemistry solution. In one embodiment, the conductive lines are recessed by wet etching at a temperature from about 15° C. to about 50° C. for a predetermined time. In at least some embodiments, the conductive lines are recessed by dry etching, e.g., plasma etching.

Figure 2H:
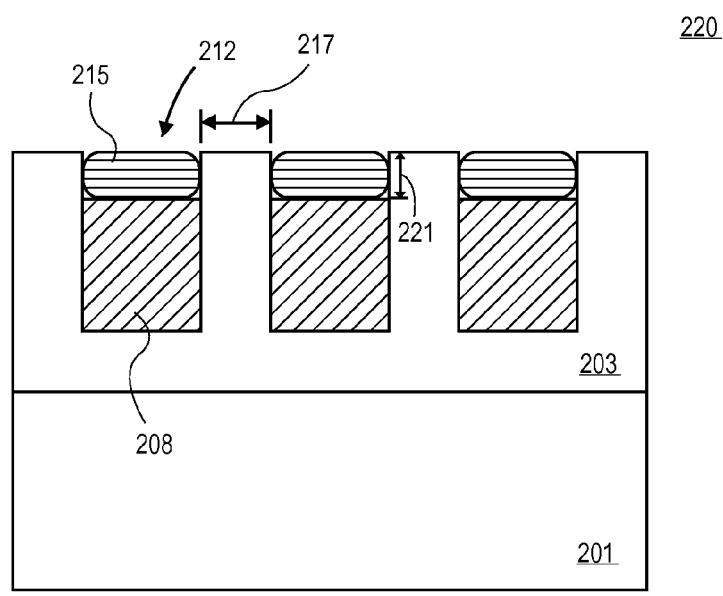
FIG. 2H is a view similar to FIG. 2G, after capping layers are selectively deposited onto the respective recessed conductive lines in the channels to prevent electromigration according to one embodiment of the invention.

FIG. 2H is a view similar to FIG. 2G, after the capping layers are selectively deposited onto the respective recessed conductive lines in the channels to prevent electromigration according to one embodiment of the invention. The conductive lines etched using the chemistry as described above, have a smooth uniform top surface to adhere the capping layer. As shown in FIG. 2H, a capping layer 215 is deposited onto recessed conductive line 208 within channel 212. In one embodiment, the channel, such as channel 212, is configured to contain a capping layer within the width of the conductive line, e.g., width 209 shown in FIG. 2F. That is, the recessed conductive line creates a channel which contains the growth of the capping layer within the channel that mitigates the reduction in line-to-line spacing and increase in LER. As shown in FIG. 2H the capping layer 215 is located on the conductive line 208 within the sidewalls of the channel 212. In one embodiment, the capping layer is deposited on the recessed conductive line by an electroless deposition (e.g., plating), a chemical vapor deposition ("CVD"), a physical vapor deposition ("PVD"), or any other selective deposition techniques known to one of ordinary skill in the art of electronic device manufacturing. In one embodiment, a conductive line, such as line 208, comprises a first metal, and the capping layer comprises a second metal other than the first metal to prevent electromigration of the first metal from the conductive line. In one embodiment, the metal for the capping layer is heavier than the metal for the conductive line to prevent electromigration.

For example, the conductive line can be made of any of the metals including copper, aluminum. In one embodiment, the capping layer, such as capping layer 215, is made of cobalt ("Co"), cobalt electroless alloys, e.g., CoBP, CoWBP, CoWP, CoWB, CoWP, or a combination thereof. In another embodiment, a capping layer, such as capping layer 215, is made of nickel ("Ni"), Ni electroless alloys, e.g., NiBP, NiWBP, NiWP, NiWB, NiWP, or a combination thereof. In another embodiment, a capping layer, such as capping layer 215, is made of platinum ("Pt") group metals, for example, Pt, Pd, Ru, Ir, Rh as pure elements or alloys. The typical alloy elements for Pt group metals are W, B, P. In yet another embodiment, a capping layer, such as capping layer 215, is made of refractory metals, for example, Ta, W, Mo, or a combination thereof.

In one embodiment, the Co capping layer is deposited within a channel onto the recessed Cu conductive layer. In one embodiment, Ni capping layer is deposited within a channel onto the recessed Cu conductive layer. In one embodiment, refractory metal capping layer is deposited within a channel onto the recessed Cu conductive layer.

In one embodiment, the capping layers comprising a Pt group metal, Co, Ni, or a combination thereof, are deposited onto the conductive layers, e.g., copper, aluminum, using any of an electroless deposition, and a vapor phase deposition, e.g., CVD. In one embodiment, the capping layers including refractory metals are deposited onto the conductive layers, e.g., copper, aluminum, using any of a CVD and PVD techniques known to one of ordinary skill in the art of electronic device manufacturing. In one embodiment, the thickness of the capping layer, e.g., a thickness 221, is from about 2 nm to about 50 nm In one embodiment, the thickness of the capping metal layer is sufficient to prevent electromigration from the underlying conductive layer. In one embodiment, the capping layer has the thickness that is no greater than the depth of the channel within which the capping layer is deposited.

Figure 3B:
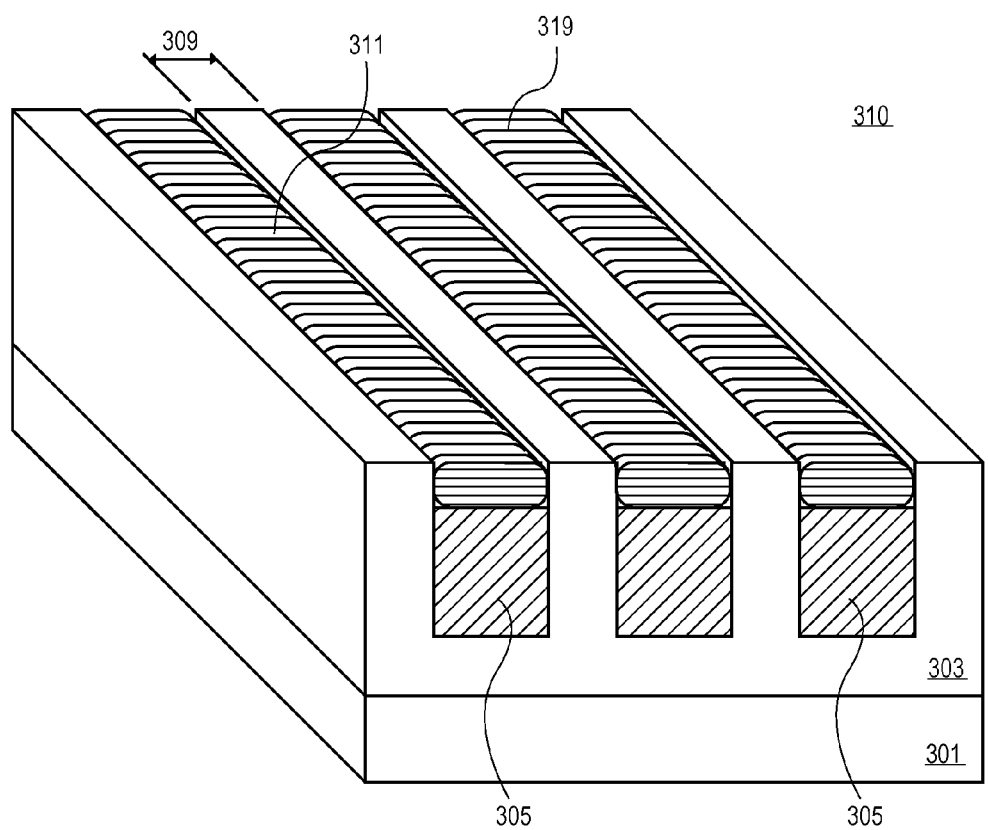
FIG. 3B is a view 310 similar to FIG. 3A, after capping layers are deposited into the respective channels formed by the recessed conductive lines according to one embodiment of the invention.

FIG. 3B is a view 310 similar to FIG. 3A, after capping layers are deposited into the respective channels formed by the recessed conductive lines according to one embodiment of the invention. As shown in FIG. 3B, capping layers, such as a capping layer 311 and 319 are selectively deposited into respective channels, such as channel 302 and channel 307, as described above. As shown in FIG. 3A, the capping layers are contained within their respective channels. As shown in FIG. 3B, the capping layer 319 is separated from capping layer 311 by spacing 309. In one embodiment, the spacing between conductive lines 305 and 304 and the spacing between capping layers 319 and 311 is the same.

Figure 4:
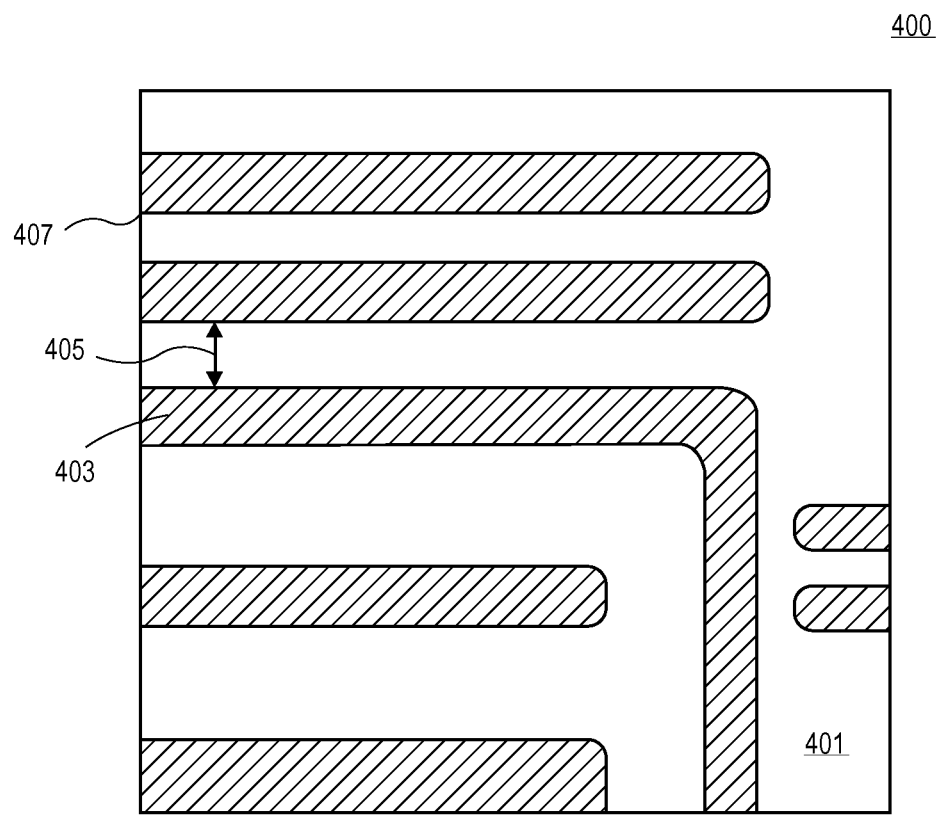
FIG. 4 is a top view of an interconnect structure 400 having capping layers selectively deposited within channels formed by the recessed conductive lines in a dielectric layer over a substrate according to one embodiment of the invention.

FIG. 4 is a top view of an interconnect structure 400 having capping layers selectively deposited within channels formed by the recessed conductive lines in a dielectric layer 401 over a substrate according to one embodiment of the invention. As shown in FIG. 4, the LER of the interconnect lines, such as an interconnect line 403 is substantially reduced, the edges of the interconnect lines are smooth, and a line-to-line spacing, such as a line-to-line spacing 405 is increased and maintained between the lines. In one embodiment, the line-to-line spacing is increased by 2× cap thickness. This can result in rather dramatic decreases in electric field and time to dielectric breakdown, especially, for a future technology node having 20 nm lines and 20 nm spaces. The minimum cap thickness known to work today is 5 nm. This means that with a conventional approach the line-line space would be 10 nm instead of the 20 nm drawn on a mask. Furthermore, currently, the size of the protrusions in the overhang tends to be about 50% of the cap thickness. For a typical cap thickness of 5-10 nm using methods described above LER can be decreased by 3-5 nm independent of line width. For a future 20 nm technology node, decrease in LER by 3-5 nm can result in 15-20% increase in line-to-line spacing of an interconnect structure.

Figure 5:
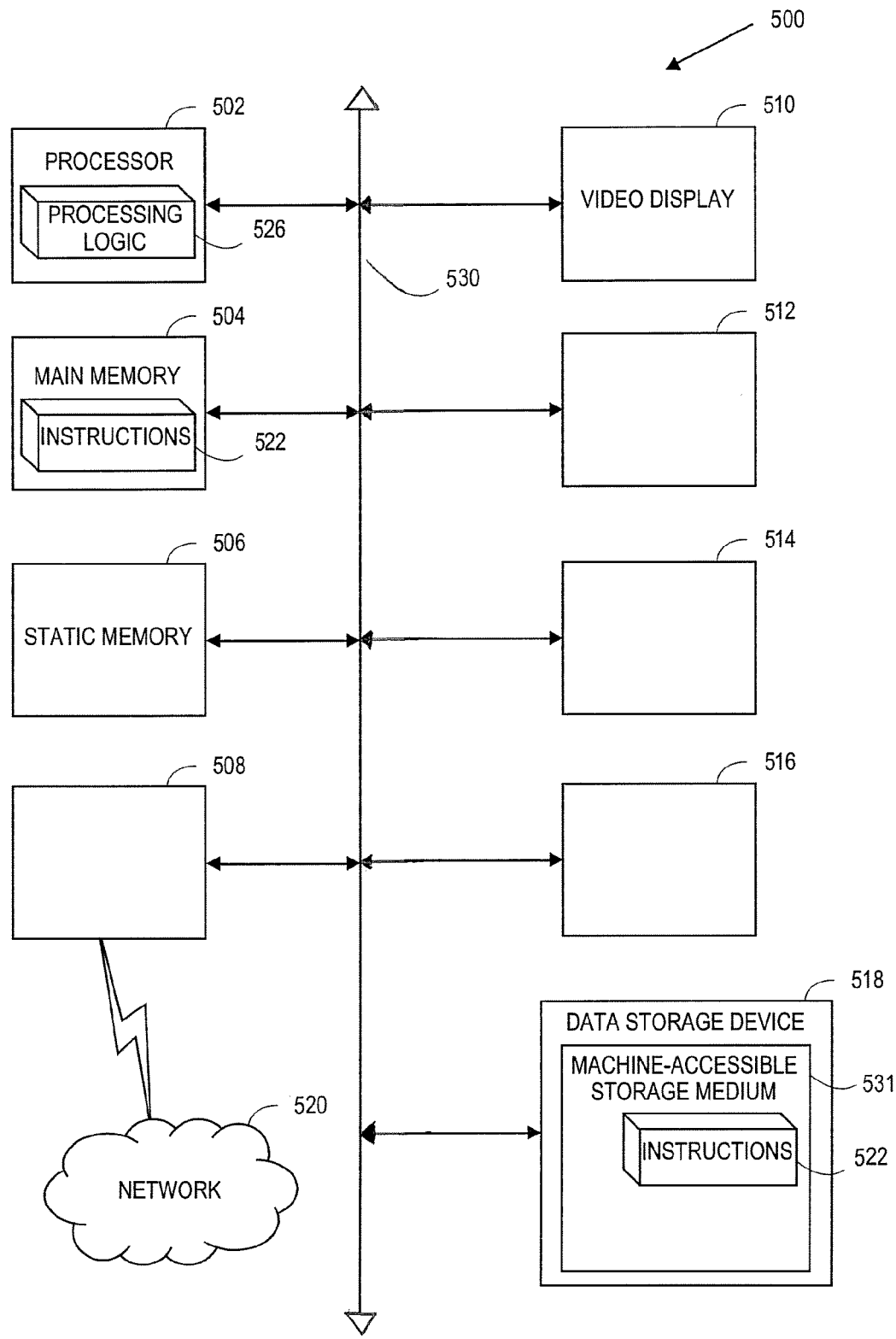
FIG. 5 shows a block diagram of an exemplary embodiment of a data processing system.

FIG. 5 shows a block diagram of an exemplary embodiment of a data processing system 500 having one or more electronic devices, e.g., transistors, memories, such as a memory 504, and a memory 518, processing logic devices, such a processing logic device 526, and any other integrated circuit and microelectronic devices that are built using methods described herein. As shown in FIG. 5, data processing system 500 includes a processor 502 having processing logic 526. In at least some embodiments, processing logic 526 contains at least one conductive line in a dielectric layer over a substrate, a channel in the dielectric layer over the one conductive line; and a capping layer on the at least one conductive line in the channel to prevent electromigration, as described herein. In at least some embodiments, each of the memories 504 and 518 contains at least one conductive line in a dielectric layer over a substrate, a channel in the dielectric layer over the one conductive line; and a capping layer on the at least one conductive line in the channel to prevent electromigration, as described herein In alternative embodiments, the data processing system may be connected (e.g., networked) to other machines in a Local Area Network (LAN), an intranet, an extranet, or the Internet. The data processing system may operate in the capacity of a server or a client machine in a client-server network environment, or as a peer machine in a peer-to-peer (or distributed) network environment. The data processing system may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that data processing system. Further, while only a single data processing system is illustrated, the term "data processing system" shall also be taken to include any collection of data processing systems that individually or jointly execute a set (or multiple sets) of instructions to perform any one or more of the methodologies described herein.

The exemplary data processing system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations described herein.

The computer system 500 may further include a network interface device 508. The computer system 500 also may include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In alternative embodiments, FIG. 5 illustrates a computing device 500. The computing device 500 houses a board 530. The board may include a number of components, including but not limited to a processor 502 and at least one communication chip 508. The processor 502 is physically and electrically coupled to the board 530. In some implementations the at least one communication chip 508 is also physically and electrically coupled to the board 530. In further implementations, the communication chip 508 is integrated within the processor 502.

Depending on its applications, computing device 500 may include other components that may or may not be physically and electrically coupled to the board 530. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, a solid state drive, a compact disk (CD) drive, a digital versatile disk (DVD) drive, and so forth).

The communication chip 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 508. For instance, a first communication chip 508 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 502 of the computing device 500 includes an integrated circuit die packaged within the processor 502. In some implementations of the invention, the integrated circuit die of the processor includes one or more devices, such as transistors or metal interconnects, that are formed using methods and apparatuses to control a line edge roughness and line-to-line spacing in deposition of self-aligned metal caps as described herein. The term "processor" may refer to any device or portion of a device that processes electronic data from registers and/or memory to transform that electronic data into other electronic data that may be stored in registers and/or memory.

The communication chip 508 also includes an integrated circuit die packaged within the communication chip 508. In accordance with another implementation of the invention, the integrated circuit die of the communication chip includes one or more devices, such as transistors or metal interconnects, that are formed using methods and apparatuses to control a line edge roughness and line-to-line spacing in deposition of self-aligned metal caps as described herein.

In further implementations, another component housed within the computing device 600 may contain an integrated circuit die that includes one or more devices, such as transistors or metal interconnects, that are formed using methods and apparatuses to control a line edge roughness and line-to-line spacing in deposition of self-aligned metal caps as described herein.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense

What is claimed is:

1. A method to manufacture an electronic device, comprising:
recessing at least one conductive line in a dielectric layer over a substrate to form a channel comprising a dielectric sidewall using a first chemistry comprising between about 0.1% to about 70% by mass of an etchant, between about 0.1% to about 10% by mass of an oxidizer, between about 50 ppm to about 1% by mass of an inhibitor and between about 1% to about 60% by mass of a solvent to provide an etching uniformity independent of a crystallographic orientation; and depositing a capping layer on the recessed conductive line and on the dielectric sidewall of the channel to prevent electromigration.

2. The method of claim 1, wherein the recessing includes forming a passivation layer on the at least one conductive line during etching using the inhibitor and the solvent, wherein the passivation layer is to ensure that the at least one conductive line is etched uniformly independent of a crystallographic orientation.

3. The method of claim 1, wherein the channel is self-aligned to the conductive line.

4. The method of claim 1, wherein the at least one conductive line is recessed to a depth determined based on a thickness of the capping layer.

5. The method of claim 1, wherein the capping layer is deposited on the recessed conductive line by an electroless plating, a chemical vapor deposition, or a physical vapor deposition.

6. The method of claim 1, further comprising
forming a dielectric layer over the substrate;
forming at least one opening in the dielectric layer; and
filling the at least one opening with a conductive material to form the at least one conductive line.

7. The method of claim 1, wherein the at least one conductive line comprises a first metal, and the capping layer comprises a second metal other than the first metal.

8. A method to control line edge roughness, comprising:
etching at least one conductive line in a dielectric layer over a substrate with a first chemistry to a predetermined depth to form a channel comprising a dielectric sidewall self-aligned to the at least one conductive line, wherein the first chemistry comprises between about 0.1% to about 70% by mass of an etchant, between about 0.1% to about 10% by mass of an oxidizer, between about 50 ppm to about 1% by mass of an inhibitor and between about 1% to about 60% by mass of a solvent to provide uniformity of etching independent of a crystallographic orientation; and depositing a capping layer on the at least one conductive line and on the dielectric sidewall of the channel.

9. The method of claim 8, wherein the etchant includes a glycine, an ethylenediaminetetraacetic acid, an alpha-amino acid, a polycarboxylic acid, or a combination thereof; the oxidizer includes a peroxide, an ozone, a permanganate, a chromate, a perborate, a hypohalite, or a combination thereof, the inhibitor includes an azole, an amine, an amino acid, a phosphate, a phosphonate, or a combination thereof, and the solvent includes water, propylene carbonate, sulfolane, glycol ethers, methylene chloride, or any combination thereof.

10. The method of claim 8, further comprising
depositing the capping layer onto the etched conductive line in the channel.

11. The method of claim 8, wherein the depth is determined based on a thickness of the capping layer.

* * * * *